United States Patent [19]

Wanlass

[11] Patent Number: 5,311,083
[45] Date of Patent: May 10, 1994

[54] VERY LOW VOLTAGE INTER-CHIP CMOS LOGIC SIGNALING FOR LARGE NUMBERS OF HIGH-SPEED OUTPUT LINES EACH ASSOCIATED WITH LARGE CAPACITIVE LOADS

[75] Inventor: Frank M. Wanlass, Sunnyvale, Calif.

[73] Assignee: Standard Microsystems Corporation, Hauppauge, N.Y.

[21] Appl. No.: 8,669

[22] Filed: Jan. 25, 1993

[51] Int. Cl.[5] .......................................... H03K 9/0177
[52] U.S. Cl. ...................................... 307/475; 307/443
[58] Field of Search ................................. 307/475, 443

[56] References Cited

U.S. PATENT DOCUMENTS

| | | | |
|---|---|---|---|
| 4,527,079 | 7/1985 | Thompson | 307/475 |
| 5,023,487 | 6/1991 | Wellheuser | 307/475 |
| 5,023,488 | 6/1991 | Gunning | 307/475 |
| 5,049,763 | 9/1991 | Rogers | 307/475 |
| 5,245,224 | 9/1993 | Suzuki | 307/475 |

OTHER PUBLICATIONS

Trevor Marshall, "Fast Transit," *Byte* magazine, Oct. 1992, pp. 122–136.

Primary Examiner—Edward P. Westin
Assistant Examiner—Andrew Sanders
Attorney, Agent, or Firm—Law Offices of Thomas E. Schatzel

[57] ABSTRACT

A CMOS integrated circuit (IC) device embodiment of the present invention comprises an internal logic circuit operating with traditional 3.3 volt or five volt internal logic levels, an output buffer to convert the internal logic levels to external logic levels of 0.3 volts and an input buffer to convert the 0.3 volt external logic levels to the internal logic levels. In a CMOS IC device having numerous external output loads including relatively high capacitive values that are driven at very high clock rates, the restricted voltage swings of the 0.3 volt external logic levels permit unusually large numbers of devices to be driven without exceeding a predetermined power dissipation limit of the CMOS IC device. The low external logic levels further permit electrostatic discharge (ESD) protection to be included on all signal inputs and outputs of the CMOS IC device. The ESD protection comprises a pair of opposite polarity silicon PN junction diodes in parallel and connected between each signal line and a ground reference.

20 Claims, 3 Drawing Sheets

VERY LOW VOLTAGE INTER-CHIP CMOS LOGIC SIGNALING FOR LARGE NUMBERS OF HIGH-SPEED OUTPUT LINES EACH ASSOCIATED WITH LARGE CAPACITIVE LOADS

BACKGROUND OF THE PRESENT INVENTION

1. Field of the Present Invention

The present invention relates to electronic digital circuitry, and more particularly to devices that enable communication among packaged CMOS logic circuits at very high communication rates and yet at relatively low dynamic power levels by using very low voltage signal swings.

2. Description of the Prior Art

Digital electronic devices and systems typically comprise several integrated circuit packages (ICs) that are interconnected on a printed circuit board assembly. Each of these ICs very often includes whole functional units, not unlike blocks in a block diagram. Digital ICs are ubiquitously supplied with five volts power and have both internal and external signal transitions that approach five volts. Five volt transistor-transistor logic (TTL) has been superseded by complementary metal-oxide-semiconductor (CMOS) logic, which also is typically operated at five volts. The CMOS logic draws far less power under static conditions, compared to TTL, but can draw much higher power under dynamic (switching) conditions because the logic must charge and discharge various stray capacitances and has very short transition times.

Advancements in CMOS fabrication processes have recently enabled the design of very high speed, very complex devices, or "chips", that are capable of clock rates in excess of fifty megahertz (MHz). Prior art CMOS logic systems experience difficulties with such high speeds, especially in inter-chip communication because of the high dynamic power currents involved.

Although the static power consumption of CMOS circuits is generally regarded as being next to insignificant, the dynamic power consumption can be very large and quite troublesome. The high currents principally result from charging and discharging of capacitances associated with internal chip nodes, and with the charging and discharging of load capacitances external to a chip. Both kinds of currents result in power, in the form of heat, being dissipated within the CMOS circuit itself. Manufacturers typically overlook this power consumption phenomenon in their published specifications by describing chip power consumption under test conditions where the outputs are open, or not loaded.

The power dissipated in such logic devices is proportional to the square of the voltage swing charging or discharging a capacitor load. The dynamic power consumption of a node may be expressed as, $$P_D = CV^2 f, \quad (1)$$

where $P_D$ is dynamic power in watts, C is the capacitance driven in farads, V is the signal swing in volts, and f is the frequency in Hertz.

Driving individual n-channel metal-oxide-semiconductor (NMOS) and p-channel metal-oxide-semiconductor (PMOS) transistors that constitute CMOS logic also causes power to dissipated. For example, if a node drives a fifty picofarad load with a five volt swing at a fifty MHz rate, equation (1) shows that 62.5 mW of dynamic power will be dissipated. ($0.0625 = 50 \times 10^{-5} \cdot 5^2 \cdot 50 \times 10^6$.) A typical internal node drives between 0.01 picofarad and 0.1 picofarad, but many thousands of internal nodes are usually involved and can add up to fifty picofarads, or more. Large chips can consume several watts of internal dynamic power when operated at high frequencies. For chips that have many output driver circuits, each driving fifty picofarads or more, external dynamic power consumption can also easily be several watts. For example, with eighty output drivers, each switching at twenty-five MHz and driving fifty picofarads, and each swinging five volts, the external power dissipated may be as much as 2.5 watts. This power must be dissipated in the output buffers, which typically comprise a relatively small percentage of the total chip area, and can therefore cause destructive overheating.

There is an industry trend developing towards lower supply voltages of 3.3 volts, rather than the more typical 5.0 volts. Such lower voltages allow more reliable short channel length transistors. CMOS circuits using 3.3 volt supplies may have a nominal 3.3 volt signal swing, and therefore has the side-effect of reducing the dynamic power consumption to 43%, according to equation (1). Although this is a significant power dissipation reduction, large chips can nevertheless still consume several watts of dynamic power.

The present invention reduces dynamic power consumption in CMOS devices by over two orders of magnitude.

Strip line circuit board techniques are called for when signaling at high speed between chips separated by more than approximately eight to ten inches. A terminating resistor network is also required at the receiving end of each signal. The termination network typically comprises two resistors, one connected between a signal line and a ground reference, and the other connected between the signal line and a supply voltage. Each resistor is typically one hundred ohms.

High speed CMOS design does not typically permit the use of such low value terminating resistors because of the high static currents that result. Such currents would cause the typical CMOS device to operate outside its safe operating area. The power consumed in a resistor is proportional to the square of the voltage across the resistor and inversely proportional to the resistor's value. Algebraically expressed, this is, $$P_R = V^2/R, \quad (2)$$

where $P_R$ is the resistive power consumption in watts, V is the signal swing in volts, and R is the terminating resistor values in ohms. For example, if one signal line is terminated with two 100 ohm resistors, and the signal swing is 3.3 volts, then $P_R$ will equal 109 mW, for just one line.

The maximum clock rate is severely limited with CMOS logic by not being able to include proper termination, for example in a long main system bus in a personal computer operating at eight to ten MHz. Only the shorter local buses are able to operate at the much higher clock rates now possible with microprocessors and cache memories.

Several outputs from different chips often share one signal line in a bus arrangement, with only one chip at a time driving the line. The other chips float their outputs. When not being floated, such outputs express very low sink and/or source driving impedances, e.g., approximately five ohms. It is therefore important that a system be designed to guarantee that no two outputs can drive a common signal line in different directions at the same time. Such bus contentions would otherwise cause catastrophic currents that could easily destroy one or more of the drivers involved. In system development this can occur accidentally, before the protective logic is in place.

Very often two inter-communicating CMOS chips reside on different circuit boards which each have a separate power supply. However, the input/output (I/O) lines are common. If one such board is powered up before the other, the I/O lines of the CMOS circuit on the powered down board should preferably be allowed to float, e.g., present a high impedance. Many commercially available CMOS circuits do not include this protection Very thin gate oxides of less than one hundred Angstroms are desirable in some devices and the newer semiconductor processes have made this practical, and therefore more common. But with such thin gate oxides, it is very difficult to provide adequate electrostatic discharge (ESD) protection, because the thin oxide barrier is so easily breached.

SUMMARY OF THE PRESENT INVENTION

It is therefore an object of the present invention to provide a CMOS device with very low voltage inter-chip signaling that may dramatically reduce the external dynamic power consumption.

It is a further object of the present invention to provide a CMOS device with very low voltage inter-chip signaling that allows for CMOS parallel resistive termination, without dissipating a concomitantly large amount of power.

It is a further object of the present invention to provide for the design of CMOS bus driver circuits that resists damage during inadvertent bus contentions.

It is a further object of the present invention to provide a CMOS device that can avoid damage to inter-connected CMOS chips in which one is powered down and the other is powered up.

It is a further object of the present invention to provide a CMOS chip with superior electrostatic discharge protection on its inputs and outputs.

Briefly, an embodiment of the present invention is a CMOS integrated circuit (IC) device that comprises an internal logic circuit operating with traditional 3.3 volt or five volt internal logic levels, an output buffer to convert the internal logic levels to external logic levels of 0.3 volts and an input buffer to convert the 0.3 volt external logic levels to the internal logic levels. In such a CMOS IC device having numerous external output loads, including relatively high capacitive values that are driven at very high clock rates, the restricted voltage swings of the 0.3 volt external logic levels permit unusually large numbers of devices to be driven without exceeding a predetermined power dissipation limit of the CMOS IC device. The low external logic levels further permit electrostatic discharge (ESD) protection to be included on all signal inputs and outputs of the CMOS IC device. The ESD protection comprises a pair of opposite polarity silicon PN junction diodes in parallel and connected between each signal line and a ground reference.

An advantage of the present invention is that a logic device is provided that has substantially lower power dissipation levels compared to prior art devices.

A further advantage of the present invention is that a logic device is provided that is protected from electrostatic discharge by simple, yet effective diode protection means.

A further advantage of the present invention is that a logic device is provided in which higher that usual operating frequencies are possible because of reduced AC switching power dissipation levels.

A further advantage of the present invention is that a logic device is provided in which far greater numbers of input/out pins are possible, compared to prior art devices, because of reduced AC switching power dissipation levels.

These and many other objects and advantages of the present invention may no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
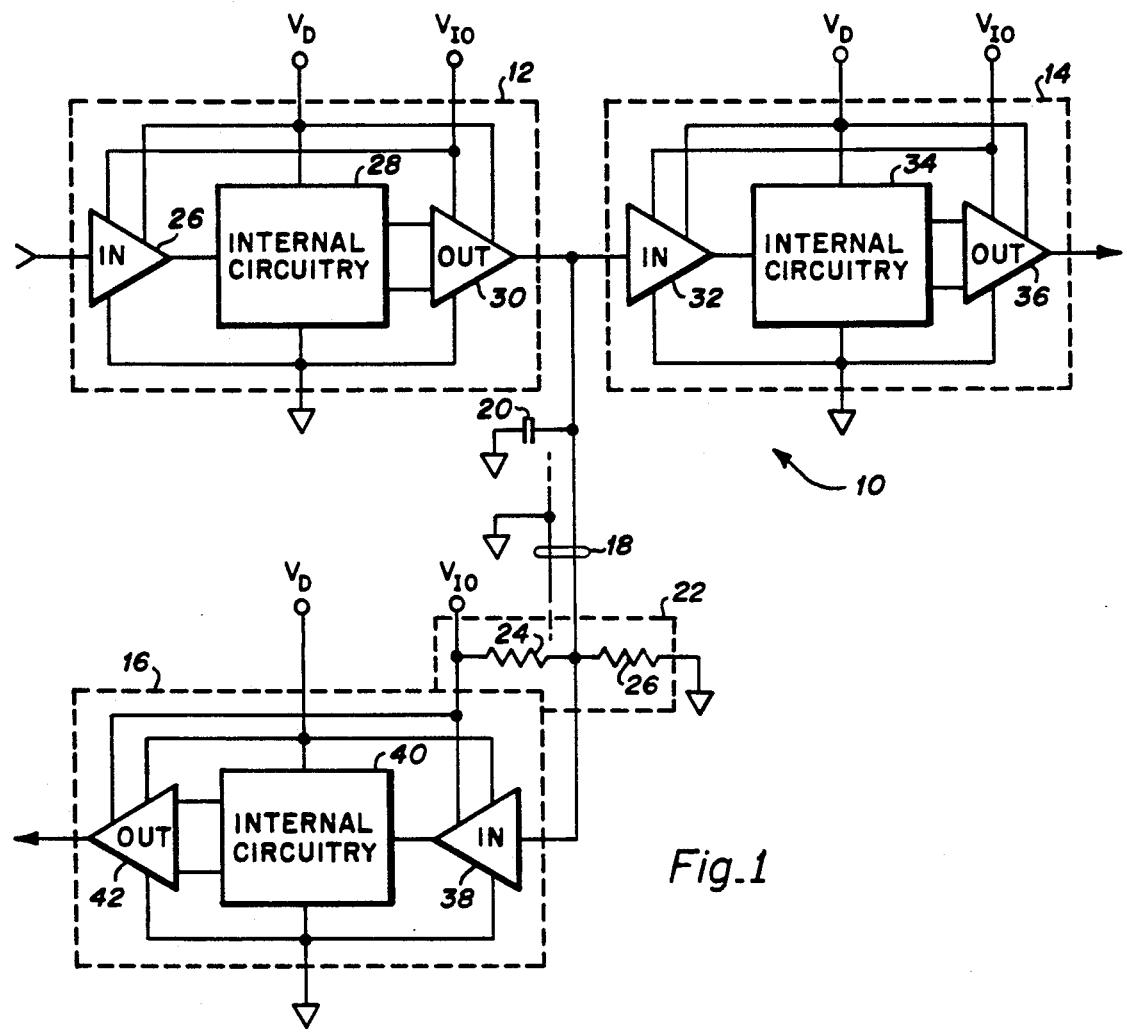
FIG. 1 is an block diagram of a system embodiment of the present invention.

FIG. 1 illustrates a CMOS-based digital system embodiment of the present invention, referred to herein by the general reference numeral 10. System 10 comprises a plurality of integrated circuit (IC) devices, a driving chip 12, a local chip 14 and a remote chip 16 that are inter-connected, at least in part, by a stripline 18. An equivalent external capacitance is represented by a capacitor 20. A terminating network 22 comprises a pair of resistors 24 and 26. Chip 12 includes a plurality of input buffers represented by an input buffer 26 that interfaces to an internal circuit 28. A plurality of buffers represented by an output buffer 30 receives signals from circuit 28. Chip 14 includes a plurality of input buffers represented by an input buffer 32 that interfaces to an internal circuit 34. A plurality of buffers represented by an output buffer 36 receives signals from circuit 34. Chip 16 also includes a plurality of input buffers, represented by an input buffer 38, that interfaces to an internal circuit 40. A plurality of buffers represented by an output buffer 42 receives signals from circuit, 40. Chips 12, 14 and 16 each receive a $V_D$ supply of 3.3 volts and a $V_{IO}$ supply of 0.3 volts.

In operation, signals among chips 12, 14 and 16 comprise voltage swings of approximately 0.3 volts, and do not exceed 0.5 volts. Much higher conventional voltage swings are permitted within circuits 28, 34 and 40, e.g., 3.3 volts. The output buffers 30, 36 and 42 translate a zero to 3.3 volt internal logic swing to an external logic swing of zero to 0.3 volts.

Figure 2:
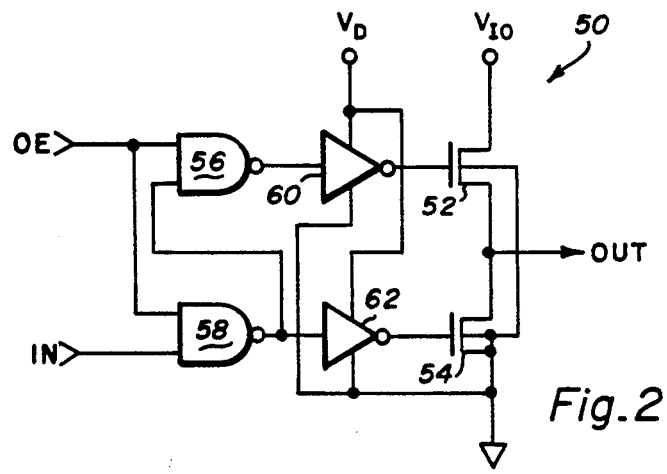
FIG. 2 is a schematic of an output buffer included in the system of FIG. 1.

FIG. 2 illustrates a tri-state CMOS buffer circuit 50 suitable for use in output buffers 30, 36 and 42. Circuit 50 includes a transistor 52 and a transistor 54, both of which are relatively large, e.g., such that their on-resistance is about five ohms. This enables a rapid driving of a large external capacitance, such as capacitor 20, which can be as great as fifty picofarads. Circuit 50 further includes a pair of NAND-gates 56 and 58 and a pair of inverters 60 and 62. An input signal "output enable" (OE) is received by both NAND-gates 56 and 58. An input signal (IN) is received by NAND-gate 58 only. If signal OE is HIGH, either transistor 52 or transistor 54 is turned on, but not both, because their control gates are driven by complementary signals from inverters 60 and 62. Since MOS transistors have no drain to source voltage offset when in the linear operation region, which occurs when the gate-to-source voltage $V_{gs}$ is greater than the drain-to-source voltage $V_{ds}$, an output signal may swing between ground reference and $V_{IO}$. If signal OE is LOW, both transistor 52 and transistor 54 are turned off, thus letting an output (OUT) float at high impedance.

Figure 3:
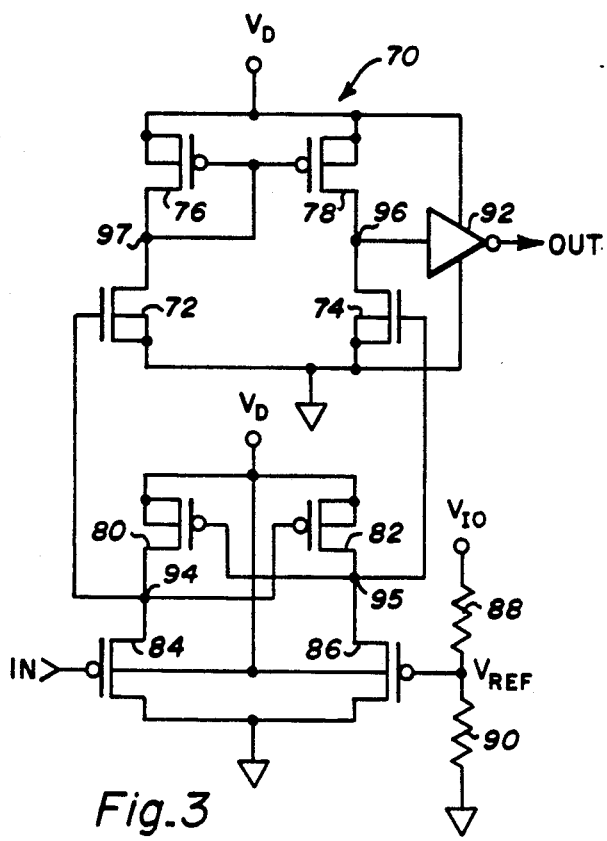
FIG. 3 is a schematic for an input buffer included in the system of FIG. 1.

The input buffers 26, 32 and 42 (FIG. 1) translate a zero to 0.3 volt input swing to an zero to 3.3 volt swing for circuits 28, 34 and 40, respectively. FIG. 3 illustrates a CMOS differential amplifier 70 for this purpose. Amplifier 70 includes a pair of NMOS transistors 72 and 74, a plurality of PMOS transistors 76, 78, 80, 82, 84 and 86, a pair of resistors 88 and 90 and an inverter 92.

In operation, an external LOW amplitude signal (IN) is applied to a gate of transistor 84, with a gate of transistor 86 tied to a reference voltage ($V_{ref}$) generated by a voltage divider formed by resistor 88 and resistor 90. If the value of resistor 88 equals the value of resistor 90, and $V_{IO}=0.3$ volts, $V_{REF}$ will equal 0.15 volts. The switching point of an input buffer formed by transistors 80, 82, 84 and 86 is thus centered within the expected input amplitudes. Similar circuits have been conventionally used for internal sense amplifiers in memory chips. Transistors 84 and 86 act as source followers to shift their near ground reference gate voltages to signals on a pair of nodes 94 and 95 that are more nearly halfway among ground reference and 3.3 volts. Transistors 80 and 82 act as an active load network for transistors 84 and 86. Transistors 72, 74, 76 and 78 resemble a conventional CMOS differential sense amplifier, wherein a voltage difference between nodes 94 and 95 will produce a full zero to 3.3 volt swing at a node 96. The inverter 92 functions as a signal buffer, so that the output (OUT) can drive a large capacitive load.

In simulations conducted by the present inventor, circuit 70 worked well when transistors 84 and 86 were made equal in size, and had about twice the width/length (W/L) aspect of equally-sized transistors 80 and 82. Transistors 72 and 74 were also equal in size and had about one third the W/L of equally-sized transistors 76 and 78. Only one pair of reference network resistors 88 and 90 are needed for an entire chip. $V_{REF}$ may be shared among all the input buffers. Resistors 88 and 90 may be made from well-diffusion type resistors, or two NMOS transistors including respective gates connected to $V_D$. For a sub-micron CMOS process, a simulated delay of about one nanosecond was recorded, and the power consumed was about one half a milliwatt.

According to equation (1), if an inter-chip signal has a 0.3 volt amplitude, the dynamic power consumption may be reduced to $(0.3/3.3)^2$, or 0.8% of what it is true for a 3.3 volt amplitude. For example, if a fifty picofarads load is being driven through a 0.3 volt swing at a fifty MHz rate, equation (1) shows that 0.225 mW of dynamic power is dissipated. This is small enough that such a signaling scheme can be used for hundreds of signals emanating from one chip, and even if those hundreds of signals have loads far exceeding fifty picofarads each.

In FIG. 1, stripline 18 typically comprises a circuit board trace in opposition to a ground reference plane on a second surface of the printed circuit board. Such a trace will exhibit a characteristic impedance that depends on the trace's width, the thickness of the printed circuit board and the dielectric constant of the material comprising the printed circuit board. When a typical trace characteristic impedance is approximately fifty ohms, resistors 24 and 26 should equal one hundred ohms, to avoid any signal reflections. Resistor 24 is connected from the signal line to 0.3 V, and resistor 26 is connected from the signal line to ground reference. This situation is electrically equivalent to a single fifty ohm resistor connected from the signal line to a zero impedance 0.15 volt source. For a driving chip which has an output impedance of approximately five ohms, the signal line is pulled to 0.3 volts $-0.015$ volts for a logic HIGH, and to less than 0.015 V for a logic LOW. For either a logic LOW or a logic HIGH, the power dissipated in terminating network 22 is only, according to equation (2), $0.3^2/100$, or 0.9 mW. This represents an improvement of over one hundred times, compared a 3.3 volt signal swing.

It is very common for the data and address buses within computers to include more than one tri-state, high-impedance floatable output buffer connected to the same line. Only one driver at a time is allowed to control a particular bus line, while the other drivers are tri-stated (floated). Great care is generally taken by system designers to prevent any two drivers from being able to control a single line simultaneously. Very large currents can flow otherwise, because the drivers will try to pull in opposite directions. For example, if an output buffer has a five ohm resistance to either ground reference or $V_D$ when on, then if there is contention there can be a 10 ohm path for current flow from $V_D$ to ground reference. The power dissipation during contention for a $V_D$ of 3.3 volts may be $P_C=3.3^2/10=1.09$ watts. This power may be dissipated in the two contending output buffers, and could lead to permanent damage. For a $V_{IO}$ of 0.3 volts, the dissipation $P_C$ is $03^2/10$, or nine milliwatts. Therefore, bus contention is not a catastrophic event with embodiments of the present invention.

If several drivers are driving a common bus, where one driver is powered up and one is powered down, it is desirable that the powered-down driver assume a high-impedance state. FIG. 2 illustrates that if $V_D$ equals zero, the gate drive to both transistors 52 and 54 will be zero, essentially tri-stating buffer 50.

For simplicity, FIG. 2 does not show a package inductance for the ground reference and $V_{IO}$ returns of transistors 52 and 54. If there are many output buffers switching simultaneously that share the same ground reference and $V_{IO}$, a large transient current flowing through package inductance can generate ground reference or $V_{IO}$ voltage noise that may be equal in amplitude to $V_{IO}$. This noise could feed through to a quiescent output and invalidate the whole scheme of low voltage signaling.

Figure 4:
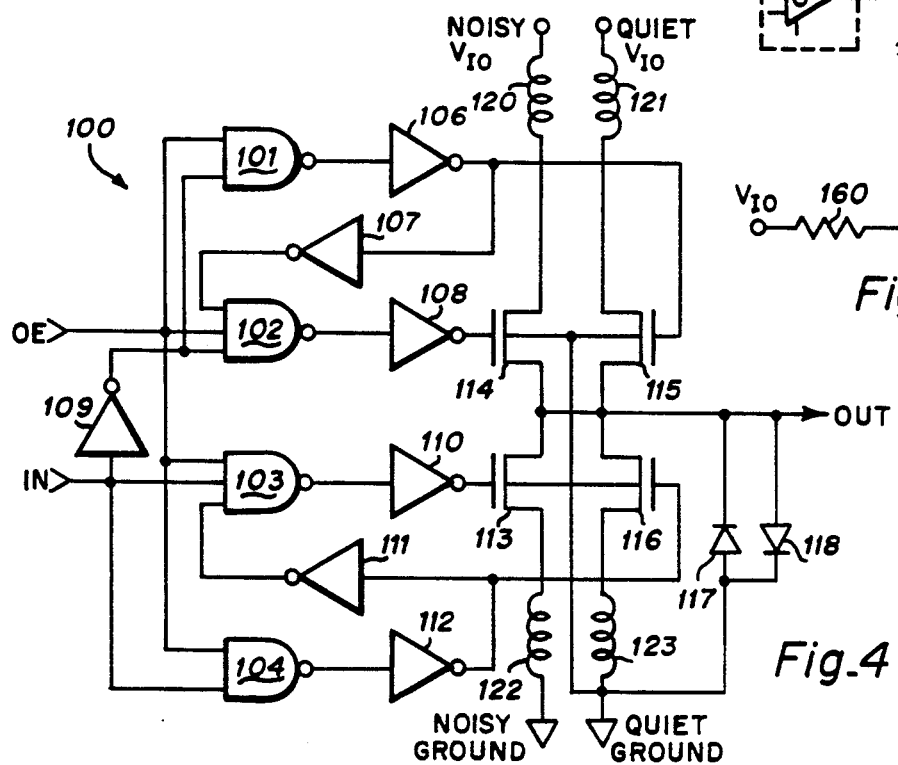
FIG. 4 is a schematic of a noise-suppressing output buffer embodiment of the present invention.

FIG. 4 illustrates an output buffer 100 for elimination of such noise. Buffer 100 includes multiple ground reference and $V_{IO}$ package pins. Buffer 100 further comprises a plurality of NAND-gates 101-105, a plurality of inverters 106-112, a set of four NMOS transistors 113-116, a pair of ESD protection diodes 117 and 118, and package inductances represented by inductors 120-123. Diodes 117 and 118 are typically semiconductor junction diodes. For example, diodes 117 and 118 comprise silicon PN junctions with forward bias voltages of approximately 0.5 to 0.7 volts. Transistor 52 (FIG. 2) is equivalent to transistors 113 and 116. Transistor 54 is equivalent to transistors 114 and 115. Transistor 113 may pull an output (OUT) LOW, during a transition from HIGH to LOW, into a "noisy" ground reference. After a delay, transistor 116 turns on to hold the output at a "quiet" ground reference, and transistor 113 turns off. Likewise, transistor 114 pulls the output (OUT) HIGH, during the transition from LOW to HIGH, into a "noisy" $V_{IO}$. After a delay, transistor 115 turns on to hold the output at a "quiet" $V_{IO}$, and transistor 114 turns off. This technique is described in further detail in a co-pending U.S. patent application, Ser. No. 07/734,752, filed Jul. 23, 1991, by the present inventor, Frank M. Wanlass. Such application is incorporated herein by reference as if fully laid out.

With reference to FIG. 4, transistors within NAND-gate 103 and inverter 110 are preferably sized such that there will a delay of less than one nanosecond to turn on the gate of transistor 113. This will occur if an input signal (OE) is HIGH, and an input signal (IN) transitions from zero to 3.3 V. Transistors within NAND-gate 104 and inverter 112 are similarly sized to cause a delay of several nanoseconds in turning on the gate of transistor 116. This delay is preferably long enough to allow signal OUT to reach logic LOW. Inverter 111 sends an inverted LOW signal to NAND-gate 103, after a gate of transistor 116 is switched HIGH, making its output HIGH, and the output of inverter 110 LOW, thus turning off transistor 113. For a rising signal IN, the output of inverter 109 transitions LOW forcing the outputs of NAND-gates 102 and 101 to transition to HIGH. The outputs of inverter 108 and 106 go LOW, which turns off transistors transistor 114 and transistor 115. The transistors in NAND-gates 102 and 101, and inverters 108 and 106 are preferably sized to have a minimum delay of less than one nanosecond in turning off transistors 114 and 115. The transistors in inverter 109, NAND-gate 102 and inverter 108 are preferably sized to have a minimum delay of less than one nanosecond in turning on the gate of transistor 114. For example, as occurs when signal OE is HIGH, and signal IN transitions from 3.3 volts to zero. Transistors within NAND-gate 101 and inverter 106 are preferably sized to cause a delay of several nanoseconds in turning the gate of transistor 115 on. This delay is preferably long enough that signal OUT first reaches logic HIGH. For a falling signal IN, the outputs of NAND-gates 104 and 103 go to logic HIGH, and the outputs of inverter 112 and inverter 110 go logic LOW, which turns off transistors 113 and 116. Transistors within NAND-gates 104 and 103, and inverters 112 and 110 are preferably sized to have a delay of less than one nanosecond to turn off transistors 113 and 116.

Diodes 117 and 118 will forward conduct when the voltage across them exceeds 0.5 volts in each direction. Therefore, a 0.3 volt signal will be unaffected, but an electrostatic discharge (ESD) will be shorted. The low voltage operating levels thus allow very simple, and yet very robust ESD protection.

Figure 5:
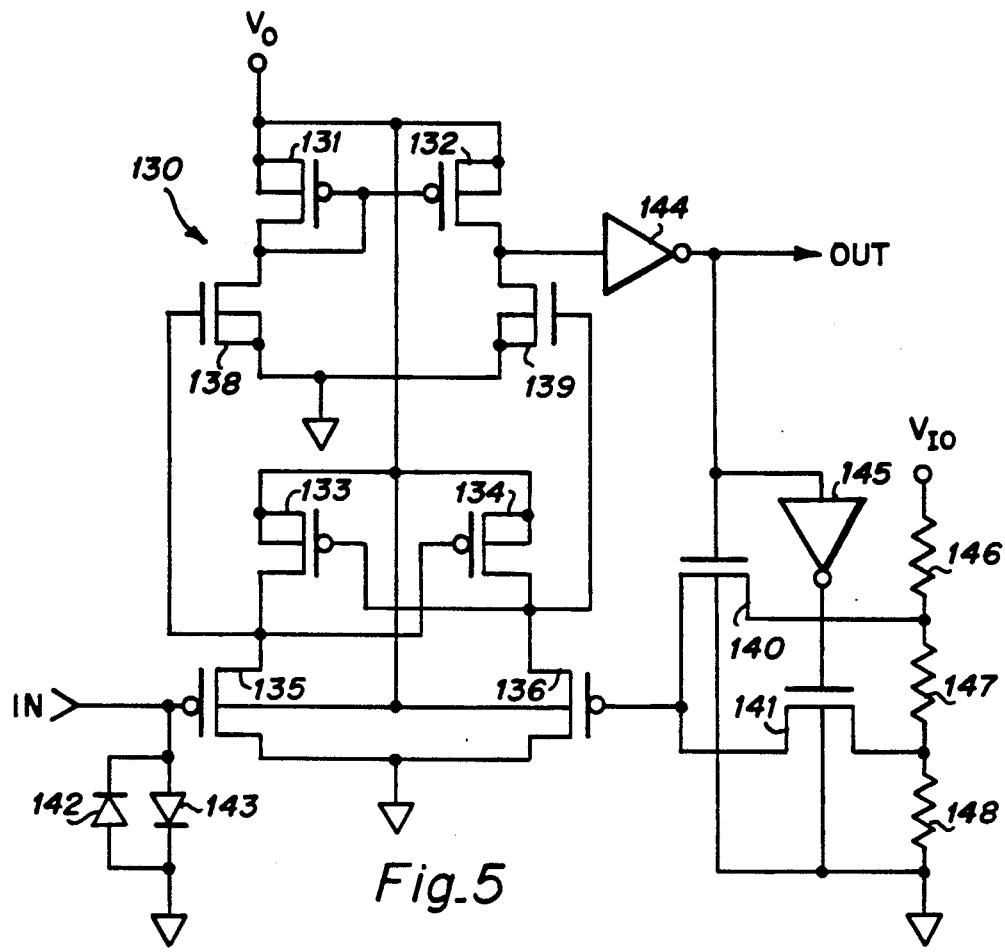
FIG. 5 is a schematic for a noise-rejecting input buffer embodiment of the present invention.

Even though buffer 100 will suppress internal chip generated noise, there may be some externally generated noise that can cause operational problems. FIG. 5 illustrates an input buffer 130 that includes hysteresis in its input-to-output transfer characteristics. Input buffer 130 comprises a plurality of PMOS transistors 131-136, a plurality of NMOS transistors 138-141, a pair of ESD diodes 142 and 143, a pair of inverters 144 and 145 and a voltage divider comprised of a set of three resistors 146-148. The preferred amount of hysteresis is controlled by the values of resistors 146-148. If these resistors are all equal in value, signal IN must rise to two-thirds of 0.3 volts for signal OUT to switch. Signal IN must fall back to one-third of 0.3 volts for signal OUT to switch. Hysteresis allows the input to be subjected to noise almost two-thirds of a full logic swing, without experiencing a false input. Resistors 146, 147 and 148 preferably appear only once in any one chip.

Figure 6:
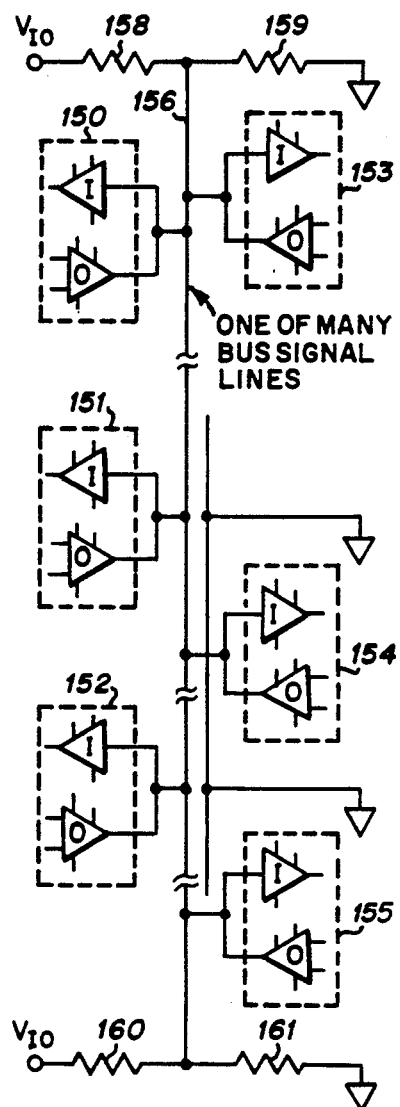
FIG. 6 is a diagram of a shared I/O signal line.

FIG. 6 illustrates a plurality of signal pads 150-155, connected to a common bus line 156, on a given chip, that may act as either outputs or inputs. Signal pads 150-155 may be used to drive long stripline traces, such as on-board and backplane address and data buses. There may typically be several chip inputs and outputs tied to a given signal trace. Termination at the extreme ends of the common line 156, such as resistors 158-161 will minimize reflections for this situation. If line 156 has a characteristic impedance of fifty ohms, then resistors 158-161 may all be equal to one hundred ohms. Since two networks are in parallel, a driver device with an output resistance of five ohms could pull line 156 to within 0.03 volts of ground reference for a logic LOW, and to within 0.03 volts of 0.3 volts for a logic HIGH, which is a tolerance of $\pm 10\%$ of $V_{IO}$.

Resistors 158-161 may be internal to a chip rather than external. NMOS transistors with their gates tied to 3.3 volts can be used to implement such internal resistors. The equivalent of a one hundred ohm resistor comprises an NMOS transistor with a W/L ratio of approximately forty to one. The exact size may depend on the parameters of a particular process.

Figure 7:
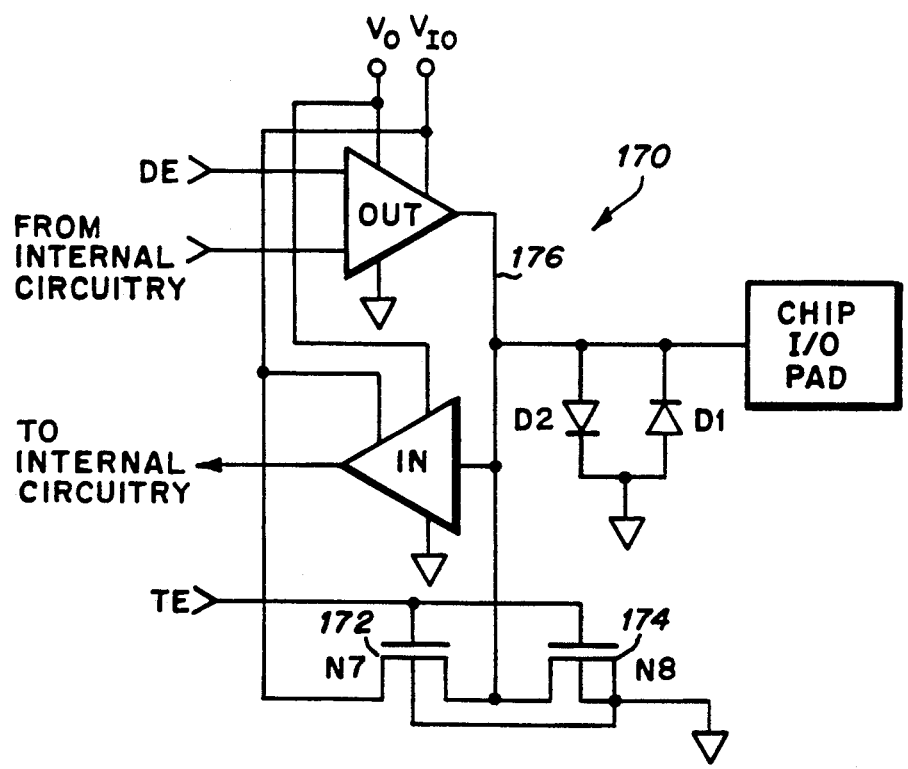
FIG. 7 is a diagram for an I/O cell embodiment of the present invention with intrinsic termination.

FIG. 7 illustrates a chip I/O cell 170 with a pair of built-in terminating transistors 172 and 174. Only I/O cells at extreme ends of a common signal line 176 will require such termination. Therefore, a termination enable signal (TE) is preferably used to control whether transistors 172 and 174 are active. For example, in FIG. 6 only chips 153 and 155 at the opposite end of strip line 156 would have such termination networks enabled. In practice, the TE signal may be shared by many I/O cells on a common chip, similar to the way the output enable signal OE is shared.

Although the present invention has been described in terms of the presently preferred embodiments, it is to be understood that the disclosure is not to be interpreted as limiting. Various alterations and modifications may no doubt become apparent to those skilled in the art after having read the above disclosure. For example, although single-ended interconnections between CMOS devices have been described herein, it would require only a simple modification of the input and output buffers to allow low voltage differential coupling. Such differential coupling is well-known in the background art as having superior common-mode noise rejection qualities. Accordingly, it is intended that the appended claims be interpreted as covering all alterations and modifications as fall within the true spirit and scope of the present invention.

What is claimed is:

1. A system including a plurality of inter-connected packaged CMOS devices, each device comprising:

input buffer means for receiving logic levels not exceeding 0.5 volts and for interfacing to an internal logic circuit operating with logic levels exceeding 3.3 volts; and output buffer means for externally transmitting logic levels not exceeding 0.5 volts and responsive to said internal logic circuit wherein system and device power operating levels are thereby limited during high-speed and high load capacitance operation.

2. The system of claim 1, further comprising:

a reference voltage terminal for receiving a voltage $V_{IO}$ not exceeding 0.5 volts connected to the input and output buffer means such that a signal output from the output buffer may operate between ground reference and $V_{IO}$, and such that the input buffer means may exhibit an input threshold of approximately one-half of said voltage $V_{IO}$.

3. The system of claim 1, wherein:

the input buffer means comprises a first pair of PMOS transistors in series with a second pair of PMOS transistors and forming a differential amplifier for providing an input signal (IN) port and an operational voltage threshold of approximately 0.15 volts, and a first pair of NMOS transistors in series with a third pair of PMOS transistors and forming an amplifier responsive to said differential amplifier and for providing an output signal (OUT) port, wherein a 0.3 volt logic signal applied to said IN port produces a 3.3 volts logic signal at said OUT port.

4. The system of claim 1, wherein:

the output buffer means comprises a pair of NAND-gates for providing an output enable (OE) control and an input signal (IN) port, a pair of buffers for operation at approximately 3.3 volts and a first pair of series connected NMOS transistors for operation at approximately 0.3 volts and providing an output signal (OUT) port responsive to said buffers and NAND-gates, wherein a 3.3 volt logic signal applied to said IN port produces a 0.3 volts logic signal at said OUT port.

5. The system of claim 1, wherein:

the input buffer means includes hysteris means for alternating an input logic level threshold between one-third and two-thirds of said input logic levels.

6. The system of claim 4, wherein:

the output buffer means further comprises a second pair of series connected NMOS transistors for operation at approximately 0.3 volts and providing a second output signal to said output signal (OUT) port responsive to said buffers and NAND-gates;

a "noisy" ground reference and power supply pair of terminals to power said first pair of series connected NMOS transistors;

a "quiet" ground reference and power supply pair of terminals to power said second pair of series connected NMOS transistors; and logic means for controlling said first pair of series connected NMOS transistors to switch first in response to an input signal change at said IN port for controlling said second pair of series connected NMOS transistors to switch second in response to said input signal change wherein adjacent quiescent channels will experience reduced ground reference bounce and power bounce currents and thereby not become unsettled.

7. The system of claim 1, wherein:

the input buffer means comprises electrostatic discharge (ESD) protection means that include two opposite polarity diodes connected in parallel between a ground reference and an input signal port of the input buffer.

8. The system of claim 1, wherein:

the output buffer means comprises electrostatic discharge (ESD) protection means that includes two opposite polarity diodes connected in parallel between a ground reference and an output signal port of the output buffer.

9. The system of claim 1, wherein:

the output buffer means comprises signal output termination means including a pull-up termination transistor and a pull-down termination transistor for connecting said signal output between a $V_{IO}$ power supply terminal and a ground reference, and further including an associated gate control means and termination enable (TE) input for managing whether said termination transistors are active or inactive according to the position of the output buffer along an external bus line wherein many such output buffer means may be coupled in common to said external bus line but in which only two operate with active termination transistors.

10. A CMOS integrated circuit device, with a limited power dissipation capability, for driving a relatively large plurality of external high capacitance loads at substantially high logic switching rates, the device comprising:

internal logic functional means for operating with internal logic signal levels substantially within the range of 3.3 to five volts and producing a relatively large plurality of signals for independent parallel communication to a plurality of external devices across respective relatively large capacitive loads; and a plurality of independent output buffer means for translating said internal logic signals to external logic levels not exceeding the forward bias voltage of a semiconductor junction diode, wherein the power dissipation when all of the plurality of independent output buffer means are driving said relatively large plurality of external high capacitance loads at a predetermined maximum switching rate is less than said limited power dissipation capability for the device.

11. The device of claim 10, further comprising:

input buffer means for receiving logic levels not exceeding 0.5 volts and for interfacing to the internal logic functional means.

12. The device of claim 11, further comprising:

reference generating means for providing a voltage $V_{IO}$ not exceeding 0.5 volts to the input and output buffer means such that a signal output from the output buffer may operate between ground reference and $V_{IO}$, and such that the input buffer means may exhibit an input threshold of approximately one-half of voltage $V_{IO}$.

13. The device of claim 11, wherein:

the input buffer means comprises a first pair of PMOS transistors in series with a second pair of PMOS transistors and forming a differential amplifier for providing an input signal (IN) port and an operational voltage threshold of approximately 0.15 volts, and a first pair of NMOS transistors in series with a third pair of PMOS transistors and forming an amplifier responsive to said differential amplifier and for providing an output signal (OUT) port, wherein a 0.3 volt logic signal applied to said IN port produces a 3.3 volts logic signal at said OUT port for the internal logic functional means.

14. The device of claim 11, wherein:
the input buffer means comprises electrostatic discharge (ESD) protection means that include two opposite polarity diodes connected in parallel between a ground reference and an input signal port of the input buffer.

15. The device of claim 10, wherein:
the output buffer means comprises electrostatic discharge (ESD) protection means that includes two opposite polarity diodes connected in parallel between a ground reference and an output signal port of the output buffer.

16. The device of claim 10, wherein:
the input buffer means includes hysteris means for alternating an input logic level threshold between one-third and two-thirds of said input logic levels.

17. The device of claim 10, wherein:
the output buffer means comprises signal output termination means including a pull-up termination transistor and a pull-down termination transistor for connecting said signal output between a $V_{IO}$ power supply terminal and a ground reference, and further including an associated gate control means and termination enable (TE) input for managing whether said termination transistors are active or inactive according to the position of the output buffer along an external bus line wherein many such output buffer means may be coupled in common to said external bus line but in which only two operate with active termination transistors.

18. A CMOS integrated circuit device, with a limited power dissipation capability, for driving a relatively large plurality of external high capacitance loads at substantially high logic switching rates, the device comprising:
internal logic functional means for operating with internal logic signal levels substantially within the range of 3.3 to five volts and producing a relatively large plurality of signals for independent parallel communication to a plurality of external devices across respective relatively large capacitive loads;
a plurality of independent output buffer means for translating said internal logic signals to external logic levels not exceeding the forward bias voltage of a semiconductor junction diode, wherein the power dissipation when all of the plurality of independent output buffer means are driving said relatively large plurality of external high capacitance loads at a predetermined maximum switching rate is less than said limited power dissipation capability for the device;
input buffer means for receiving logic levels not exceeding 0.5 volts and for intefacing to the internal logic functional means; and
reference generating means for providing a voltage $V_{IO}$ not exceeding 0.5 volts to the input and output buffer means such that a signal output from the output buffer may operate between ground reference and $V_{IO}$, and such that the input buffer means may exhibit an input threshold of approximately one-half of voltage $V_{IO}$.

19. The device of claim 18, wherein the input buffer means comprises:
a first pair of PMOS transistors in series with a second pair of PMOS transistors and forming a differential amplifier for providing an input signal (IN) port and an operational voltage threshold of approximately 0.15 volts, and a first pair of NMOS transistors in series with a third pair of PMOS transistors and forming an amplifier responsive to said differential amplifier and for providing an output signal (OUT) port, wherein a 0.3 volt logic signal applied to said IN port produces a 3.3 volts logic signal at said OUT port for the internal logic functional means;
electrostatic discharge (ESD) protection means that include two opposite polarity diodes connected in parallel between a ground reference and an input signal port of the input buffer; and
hysteris means for alternating an input logic level threshold between one-third and two-thirds of said input logic levels 20. The device of claim 18, wherein each of the output buffer means comprises:
electrostatic discharge (ESD) protection means that includes two opposite polarity diodes connected in parallel between a ground reference and an output signal port of the output buffer; and
signal output termination means including a pull-up termination transistor and a pull-down termination transistor for connecting said signal output between a $V_{IO}$ power supply terminal and a ground reference, and further including an associated gate control means and termination enable (TE) input for managing whether said termination transistors are active or inactive according to the position of the output buffer along an external bus line wherein many such output buffer means may be coupled in common to said external bus line but in which only two operate with active termination transistors.

* * * * *